United States Patent
Choi et al.

(10) Patent No.: US 8,952,384 B2
(45) Date of Patent: Feb. 10, 2015

(54) TFT, MASK FOR MANUFACTURING THE TFT, ARRAY SUBSTRATE AND DISPLAY DEVICE

(71) Applicant: BOE Technology Group Co., Ltd., Beijing (CN)

(72) Inventors: Seungjin Choi, Beijing (CN); Seongyeol Yoo, Beijing (CN); Youngsuk Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 13/883,858

(22) PCT Filed: Dec. 6, 2012

(86) PCT No.: PCT/CN2012/086066
§ 371 (c)(1),
(2) Date: May 7, 2013

(87) PCT Pub. No.: WO2013/149477
PCT Pub. Date: Oct. 10, 2013

(65) Prior Publication Data
US 2014/0054702 A1 Feb. 27, 2014

(30) Foreign Application Priority Data
Apr. 6, 2012 (CN) .......................... 2012 1 0100442

(51) Int. Cl.
*H01L 29/04* (2006.01)
(52) U.S. Cl.
USPC ................................ 257/59; 257/57; 257/347

(58) Field of Classification Search
CPC ............. G03F 1/00; G03F 1/22; H01L 29/10; H01L 29/41733; H01L 17/1288; H01L 27/1241
USPC ............. 257/57; 438/149–151, 157–158, 197
See application file for complete search history.

(56) References Cited

U.S. PATENT DOCUMENTS

| 7,445,970 | B2 * | 11/2008 | Lai ............................... 438/149 |
| 7,449,570 | B2 | 11/2008 | Wilde et al. |
| 8,395,158 | B2 * | 3/2013 | Yamazaki et al. .............. 257/59 |
| 2005/0041169 | A1 * | 2/2005 | Hashimoto et al. ............. 349/43 |
| 2008/0073718 | A1 * | 3/2008 | Lee et al. ...................... 257/347 |
| 2008/0135846 | A1 * | 6/2008 | Shin et al. ....................... 257/59 |

(Continued)

FOREIGN PATENT DOCUMENTS

| CN | 101387825 B | 4/2011 |
| CN | 101598894 B | 7/2011 |

(Continued)

OTHER PUBLICATIONS

International Search Report mailed Jul. 3, 2013; PCT/CN2012/086066.

(Continued)

*Primary Examiner* — Dung A. Le
(74) *Attorney, Agent, or Firm* — Ladas & Parry LLP

(57) ABSTRACT

Embodiments of the invention relate to a TFT, a mask for manufacturing the TFT, an array substrate and a display device. A channel of the TFT is formed by using a single slit mask. The channel of the TFT has a bent portion and extension portions provided on both sides of the bent portion, and a channel width of the bent portion is larger than a channel width of the extension portion.

19 Claims, 2 Drawing Sheets

(56) References Cited

U.S. PATENT DOCUMENTS

| | | | |
|---|---|---|---|
| 2009/0068571 A1* | 3/2009 | Dong et al. | 430/5 |
| 2009/0068572 A1 | 3/2009 | Lv et al. | |
| 2010/0320464 A1* | 12/2010 | Chang et al. | 257/57 |
| 2011/0156046 A1 | 6/2011 | Kim et al. | |

FOREIGN PATENT DOCUMENTS

| | | |
|---|---|---|
| CN | 102655175 A | 9/2012 |
| KR | 20080048323 A | 6/2008 |
| KR | 20080048738 A | 6/2008 |
| KR | 20080053977 A | 6/2008 |
| KR | 20110074262 A | 6/2011 |

OTHER PUBLICATIONS

First Chinese Office Action dated Jan. 13, 2014; Appln. No. 201210100442.4.

Korean Examination Opinion dated Mar. 25, 2014; Appln. No. 10-2013-7012242.

International Preliminary Report on Patentability dated Oct. 7, 2014; PCT/CN2012/086066.

Korean Examination Opinion Issued Sep. 25, 2014; Appln. No. 10-2013-7012242.

Korean Office Action Dated Nov. 27, 2014; Appln. No. 10-2013-7012242.

* cited by examiner

TFT, MASK FOR MANUFACTURING THE TFT, ARRAY SUBSTRATE AND DISPLAY DEVICE

FIELD OF THE INVENTION

Embodiments of the invention relate to a Thin Film Transistor (TFT), a mask for manufacturing the TFT, an array substrate and a display device.

BACKGROUND

In the field of flat panel display, TFT is a key element for manufacturing a display device. There is a need to continually improve the characteristics of the TFT to achieve a better display quality. One of the research tendencies is to reduce the channel width of the TFT so as to achieve better characteristics. Presently, Single Slit Mask (SSM) is often used to manufacture the TFT channel with a width below 4 μm. FIG. 1 is a structural schematic view showing a conventional TFT channel manufactured by the SSM. As shown in FIG. 1, the TFT channel is provided between a source electrode 1 and a drain electrode 2, and has a U-shaped structure. The U-shaped structure includes a bent portion B and extension portions A provided on both sides of the bent portion B. The channel width at each of the bent portion B and the extension portions A is L. When forming the TFT channel with the width L of 3-3.5 μm, transmittance at the bent portion B may be somewhat reduced compared to that at the extension portions A, decrease of the transmittance may easily occur at the bent portion B of the channel upon performing an exposing process, and accordingly photoresist at this portion may not be removed completely in the following developing process. In this case, short circuit may occur between the source electrode and the drain electrode at the bent portion B after the patterning process is completed.

SUMMARY OF THE INVENTION

According to an embodiment of the invention, there is provided a thin film transistor (TFT). The channel of the TFT is formed by using a single slit mask. The channel of the TFT has a bent portion and extension portions provided on both sides of the bent portion, and a channel width of the bent portion is larger than a channel width of the extension portion.

According to another embodiment of the invention, there is provided a mask for manufacturing the TFT. The mask has a single slit corresponding to a channel of the TFT. The single slit has a bent portion and extension portions provided on both sides of the bent portion, and a slit width of the bent portion is larger than a slit width of the extension portion.

According to still another embodiment of the invention, there is provided an array substrate. The array substrate includes the TFT mentioned above.

According to still another embodiment of the invention, there is provided a display device. The display device includes the TFT mentioned above.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Embodiment 1

Figure 1:
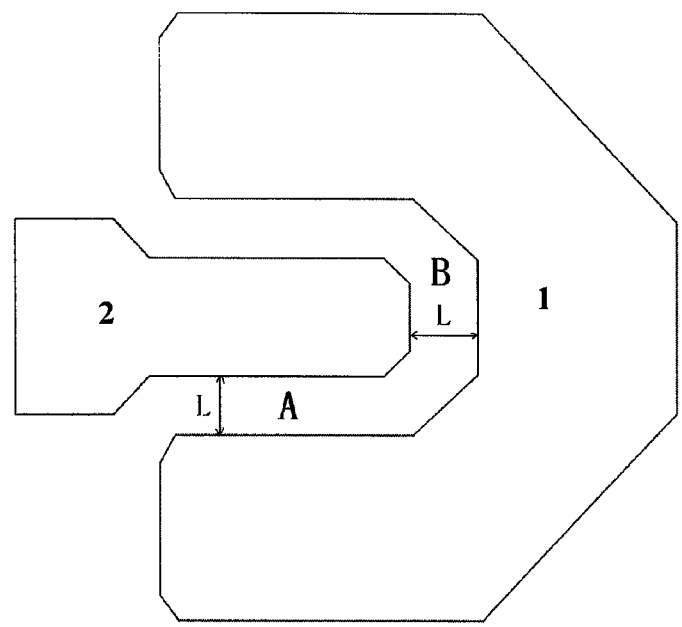
FIG. 1 is a structural schematic view showing a channel of a conventional TFT manufactured by a SSM.
Figure 2:
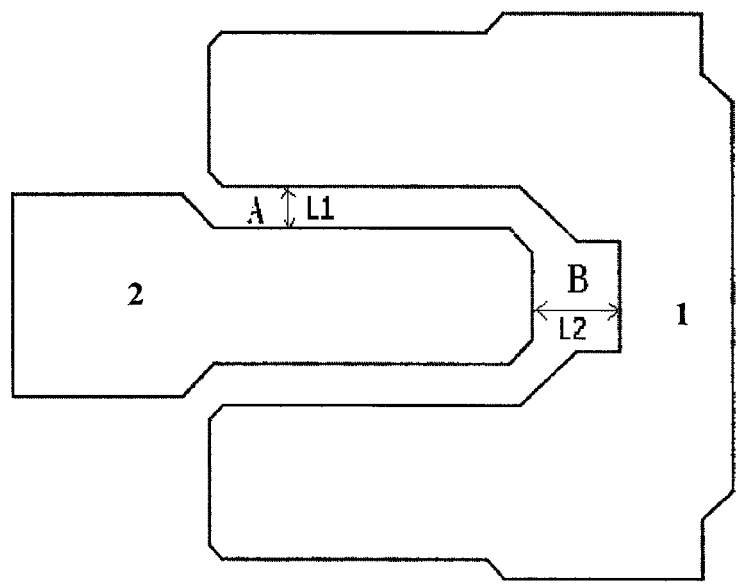
FIGS. 2-4 are structural schematic views showing a mask for manufacturing a TFT according to embodiments of the invention.

This embodiment provides a mask for manufacturing a thin film transistor (TFT). As shown in FIG. 2, the mask has a single slit corresponding to a channel of the TFT. The single slit has a bent portion B and extension portions A provided on both sides of the bent portion B, and the slit width of the bent portion B is larger than the slit width of the extension portion A.

For example, as shown in FIG. 2, the slit is formed into a U shape.

For example, the width of the slit is between 1 μm and 5 μm.

Figure 3:
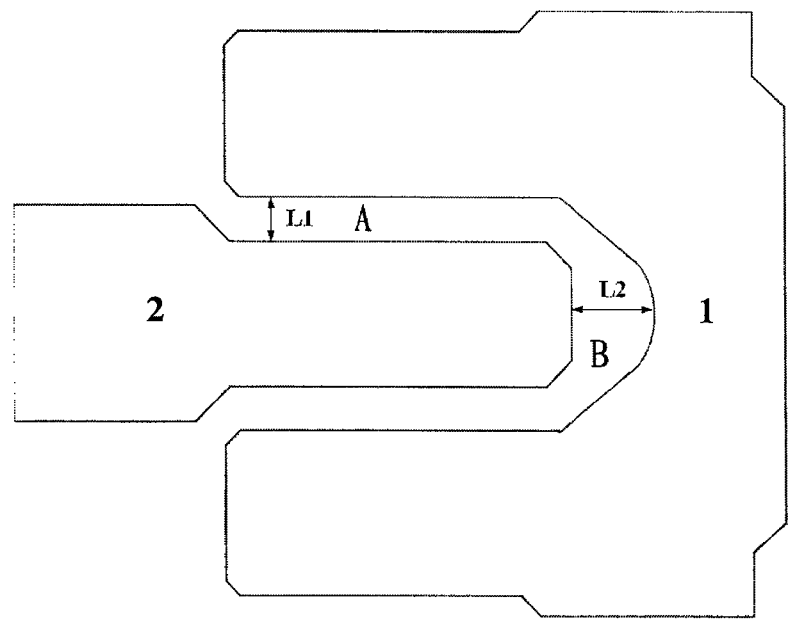

The mask further has a first region 1 corresponding to a source electrode of the TFT and a second region 2 corresponding to a drain electrode of the TFT. The slit corresponding to the channel of the TFT is provided between the first region 1 and the second region 2. The first region 1 and the second region 2 are opaque regions. In order that the slit width of the bent portion B is larger than the slit width of the extension portion A, the first region 1 is concave along a direction opposite to a direction towards the second region 2 at the bent portion B of the slit. As shown in FIG. 2, the shape of the concave portion is rectangular. As shown in FIG. 3, the shape of the concave portion is semicircular. Further, the shape of the concave portion may be semi-elliptical. However, the shape of the concave portion may be not limited to be rectangular, semicircular, or semi-elliptical.

Preferably, the slit width of the bent portion B is between 2.5 μm and 5 μm, which is larger than the conventionally employed size. In this case, the transmittance at the bent portion B can be increased, and thus the channel defects arising easily at the bent portion B can be avoided. More preferably, the slit width of the bent portion B is below 4 μm, because the characteristics of the TFT can be further improved when the channel width of the TFT is below 4 μm.

Preferably, the slit width of the extension portion A is between 1 μm and 4 μm. The slit width of this portion may be selected according to the practical requirements on product performances.

By using the above mentioned mask, the channel defects can be prevented in the case that the channel of the TFT maintains the shortest. Therefore, the performance of the TFT can be improved and the product yield can be increased.

Embodiment 2

Figure 4:
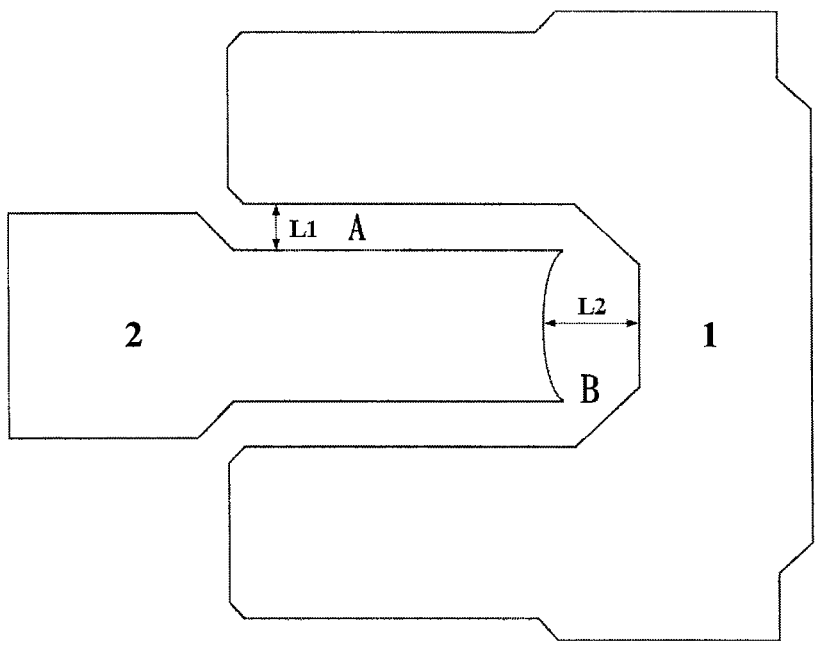

This embodiment provides a mask for manufacturing a thin film transistor (TFT). As shown in FIG. 4, the mask has a single slit corresponding to a channel of the TFT. The single slit has a bent portion B and extension portions A provided on both sides of the bent portion B, and the slit width of the bent portion B is larger than the slit width of the extension portion A.

For example, as shown in FIG. 4, the slit is formed into a U shape.

For example, the width of the slit is between 1 µm and 5 µm.

The mask further has a first region 1 corresponding to a source electrode of the TFT and a second region 2 corresponding to a drain electrode of the TFT. The slit corresponding to the channel of the TFT is provided between the first region 1 and the second region 2. The first region 1 and the second region 2 are opaque regions. In order that the slit width of the bent portion B is larger than the slit width of the extension portion A, the second region 2 is concave along a direction opposite to a direction towards the first region 1 at the bent portion B of the slit. The shape of the concave portion may be rectangular, semicircular, or semi-elliptical. As shown in FIG. 4, the slit width of the bent portion B is larger than the slit width of the extension portion A, which can increase the transmittance at the bent portion B.

Preferably, the slit width of the bent portion B is between 2.5 µm and 5 µm, which is larger than the conventionally employed size. In this case, the transmittance at the bent portion B can be increased, and thus the channel defects arising easily at the bent portion B can be avoided. More preferably, the slit width of the bent portion B is below 4 µm, because the characteristics of the TFT can be further improved when the channel width of the TFT is below 4 µm.

Preferably, the slit width of the extension portion A is between 1 µm and 4 µm. The slit width of this portion may be selected according to the practical requirements on product performances.

By using the above mentioned mask, the channel defects can be prevented in the case that the channel of the TFT maintains the shortest. Therefore, the performance of the TFT can be improved and the product yield can be increased.

Embodiment 3

This embodiment provides a TFT. A channel of the TFT is formed by using a single slit mask. The single slit mask is a gray-tone mask. The width of the channel is between 2 µm and 6 µm.

The channel of the TFT according to this embodiment has a bent portion B and extension portions A provided on both sides of the bent portion B, and the channel width of the bent portion B is larger than the channel width of the extension portion A.

For example, the channel of the TFT is U-shaped.

The TFT according to this embodiment further has a source electrode and a drain electrode, and the channel is provided between the source electrode and the drain electrode. At the bent portion B of the channel, the source electrode is concave along a direction opposite to a direction towards the drain electrode, and thus the channel width of the bent portion B becomes larger. The shape of the concave portion may be but not limited to rectangular, semicircular, semi-elliptical and the like. The channel in which the concave portion is rectangular may be made by the mask shown in FIG. 2, whereas the channel in which the concave portion is semicircular may be made by the mask shown in FIG. 3.

Preferably, the channel width of the bent portion B is between 3 µm and 6 µm.

Preferably, the channel width of the extension portion A is between 2 µm and 2.5 µm. The channel width of the extension portion A may be selected according to the practical requirements on product performances.

In the TFT according to this embodiment, the channel defects can be prevented in the case that the channel maintains the shortest. Therefore, the performance of the TFT can be improved and the product yield can be increased.

Embodiment 4

This embodiment provides a TFT. The channel of the TFT is formed by using a single slit mask. The single slit mask is a gray-tone mask. The width of the channel is between 2 µm and 6 µm.

The channel of the TFT according to this embodiment has a bent portion B and extension portions A provided on both sides of the bent portion B, and the channel width of the bent portion B is larger than the channel width of the extension portion A.

For example, the channel of the TFT is U-shaped.

The TFT according to this embodiment further has a source electrode and a drain electrode, and the channel is provided between the source electrode and the drain electrode. At the bent portion B of the channel, the drain electrode is concave along a direction opposite to a direction towards the source electrode, and thus the channel width of the bent portion B becomes larger. The shape of the concave portion may be but not limited to rectangular, semicircular, semi-elliptical and the like. The channel in which the concave portion is semicircular may be made by the mask shown in FIG. 4.

Preferably, the channel width of the bent portion B is between 3 µm and 6 µm.

Preferably, the channel width of the extension portion A is between 2 µm and 2.5 µm. The channel width of the extension portion A may be selected according to the practical requirements on product performances.

In the TFT according to this embodiment, the channel defects can be prevented in the case that the channel maintains the shortest. Therefore, the performance of the TFT can be improved and the product yield can be increased.

Embodiment 5

This embodiment provides a method for manufacturing the TFT of embodiment 3 by using the mask of embodiment 1, the method includes the following steps:

step S1: forming a conductive gate metal layer on a substrate, and forming a gate electrode on the substrate by a first patterning process; forming a gate insulation layer on the gate electrode; and then forming a semiconductor layer and a source/drain metal layer on the gate insulation layer;

step S2: performing a second patterning process by using the single slit mask provided in the above-described embodiment 1 to pattern the source/drain metal layer and the semiconductor layer, so that an active layer, a source electrode, a drain electrode and a channel are formed.

In step S2, a photoresist layer is coated on the source/drain metal layer, and then the photoresist layer is exposed by using the single slit mask provided in embodiment 1 to form a photoresist-completely-remained region corresponding to regions of the source electrode and the drain electrode, a photoresist-partially-remained region corresponding to a region of the channel and a photoresist-completely-removed region corresponding to other regions. The source/drain metal layer and the semiconductor layer in the photoresist-completely-removed region are etched away to form active layer. The photoresist layer in the region of the channel is removed by an ashing process. The source/drain metal layer in the region of the channel is etched away to form the source electrode, the drain electrode and the channel. The remaining portion of the photoresist layer is removed to obtain the TFT.

In this step, due to the influences of the process margins in the exposing, developing and etching processes, the channel width of the resultant TFT may be not exactly coincident with the slit width of the mask, which belongs to a reasonable and acceptable process error. For example, the slit width of the mask is between 1 µm and 5 µm, whereas the channel width of the TFT is between 2 µm and 6 µm.

In this embodiment, the respective layers may be formed by a spin-coating method, a depositing method, a sputtering method and the like, and may be patterned by using a conventional process such as a photolithography process, a printing process and the like.

Embodiment 6

This embodiment provides a method for manufacturing the TFT of embodiment 4 by using the mask of embodiment 2, the method includes the following steps:

step S1: forming a conductive gate metal layer on a substrate, and forming a gate electrode on the substrate by a first patterning process; forming a gate insulation layer on the gate electrode; and then forming a semiconductor layer and a source/drain metal layer on the gate insulation layer;

step S2: performing a second patterning process by using the single slit mask provided in the above-described embodiment 2 to pattern the source/drain metal layer and the semiconductor layer, so that an active layer, a source electrode, a drain electrode and a channel are formed.

In step S2, a photoresist layer is coated on the source/drain metal layer, and then the photoresist layer is exposed by using the single slit mask provided in embodiment 2 to form a photoresist-completely-remained region corresponding to regions of the source electrode and the drain electrode, a photoresist-partially-remained region corresponding to a region of the channel and a photoresist-completely-removed region corresponding to other regions. The source/drain metal layer and the semiconductor layer in the photoresist-completely-removed region are etched away to form active layer. The photoresist layer in the region of the channel is removed by an ashing process. The source/drain metal layer in the region of the channel is etched away to form the source electrode, the drain electrode and the channel. The remaining portion of the photoresist layer is removed to obtain the TFT.

In this step, due to the influences of the process margins in the exposing, developing and etching processes, the channel width of the resultant TFT may be not exactly coincident with the slit width of the mask, which belongs to a reasonable and acceptable process error. For example, the slit width of the mask is between 1 µm and 5 µm, whereas the channel width of the TFT is between 2 µm and 6 µm.

In this embodiment, the respective layers may be formed by a spin-coating method, a depositing method, a sputtering method and the like, and may be patterned by using a conventional process such as a photolithography process, a printing process and the like.

Meanwhile, the embodiments of the invention also provide an array substrate. The array substrate includes any one of the TFTs described in the above embodiments.

Furthermore, the embodiments of the invention also provide a display device. The display device includes any one of the TFTs described in the above embodiments. The display device may be any products or components having display function, such as a liquid crystal panel, an electronic paper, an OLED panel, a liquid crystal television, a liquid crystal display, a digital photo frame, a mobile phone, a tablet PC and the like.

The embodiments described above are only exemplary implementation of the invention, and are not used to limit the invention. The protection scope of the invention is defined by the accompanying claims.

What is claimed is:

1. A thin film transistor, a channel of which being formed by using a single slit mask, wherein the channel of the thin film transistor has a U shape and comprises a bent portion and extension portions, the bent portion is provided at a bottom of the U shape, the extension portions are provided on both sides of the U shape, and a channel width of the bent portion is larger than a channel width of the extension portion.

2. The thin film transistor according to claim 1, wherein the thin film transistor further has a source electrode and a drain electrode, the channel is provided between the source electrode and the drain electrode, and the source electrode is concave along a direction opposite to a direction towards the drain electrode to form a concave portion at the bent portion.

3. The thin film transistor according to claim 1, wherein the thin film transistor further has a source electrode and a drain electrode, the channel is provided between the source electrode and the drain electrode, and the drain electrode is concave along a direction opposite to a direction towards the source electrode to form a concave portion at the bent portion.

4. The thin film transistor according to claim 2, wherein the concave portion is rectangular, semicircular or semi-elliptical.

5. The thin film transistor according to claim 1, wherein a width of the channel is between 2 µm and 6 µm.

6. The thin film transistor according to claim 1, wherein the channel width of the bent portion is between 3 µm and 6 µm.

7. The thin film transistor according to claim 1, wherein the channel width of the extension portion is between 2 µm and 2.5 µm.

8. A mask for manufacturing a thin film transistor, wherein the mask has a single slit corresponding to a channel of the thin film transistor, the single slit has a U shape and comprises a bent portion and extension portions, the bent portion is provided at a bottom of the U shape, the extension portions are provided on both sides of the U shape, and a slit width of the bent portion is larger than a slit width of the extension portion.

9. The mask for manufacturing the thin film transistor according to claim 8, wherein the mask further has a first region corresponding to a source electrode of the thin film transistor and a second region corresponding to a drain electrode of the thin film transistor, the single slit corresponding to the channel of the thin film transistor is provided between the first region and the second region, and the first region is concave along a direction opposite to a direction towards the second region to form a concave portion at the bent portion.

10. The mask for manufacturing the thin film transistor according to claim 8, wherein the mask further has a first region corresponding to a source electrode of the thin film transistor and a second region corresponding to a drain electrode of the thin film transistor, the single slit corresponding to the channel of the thin film transistor is provided between the first region and the second region, and the second region is concave along a direction opposite to a direction towards the first region to form a concave portion at the bent portion.

11. The mask for manufacturing the thin film transistor according to claim 9, wherein the concave portion is rectangular, semicircular or semi-elliptical.

12. The mask for manufacturing the thin film transistor according to claim 9, wherein the first region and the second region are opaque regions.

13. The mask for manufacturing the thin film transistor according to claim 8, wherein a width of the slit is between 1 µm and 5 µm.

14. The mask for manufacturing the thin film transistor according to claim 8, wherein the slit width of the bent portion is between 2.5 µm and 5 µm.

15. The mask for manufacturing the thin film transistor according to claim 8, wherein the slit width of the extension portion is between 1 µm and 4 µm.

16. An array substrate including the thin film transistor according to claim 1.

17. The thin film transistor according to claim 3, wherein the concave portion is rectangular, semicircular or semi elliptical.

18. The mask for manufacturing the thin film transistor according to claim 10, wherein the concave portion is rectangular, semicircular or semi-elliptical.

19. The mask for manufacturing the thin film transistor according to claim 10, wherein the first region and the second region are opaque regions.

\* \* \* \* \*